United States Patent [19]

Dennerlein et al.

[11] Patent Number: 5,511,239
[45] Date of Patent: Apr. 23, 1996

[54] MOBILE RADIO SYSTEM/TRANSMITTER WITH A CONTROLLABLE POWER AMPLIFIER

[75] Inventors: Ludwig Dennerlein, Eckental; Christian Wunsch, Rothenbach, both of Germany

[73] Assignee: U.S. Philips Corporation, New York, N.Y.

[21] Appl. No.: 241,838

[22] Filed: May 12, 1994

[30] Foreign Application Priority Data

May 18, 1993 [DE] Germany ............... 43 16 526.5

[51] Int. Cl.⁶ .................... H01Q 11/12; H04B 1/04
[52] U.S. Cl. ............................. 455/126; 455/127
[58] Field of Search ................... 455/67.1, 115, 455/116, 126, 127; 330/279, 129, 134, 278; 370/95.3

[56] References Cited

U.S. PATENT DOCUMENTS

| 4,654,882 | 3/1987 | Ikeda | 455/126 |
| 5,109,538 | 4/1992 | Ikonen et al. | 455/126 |
| 5,179,353 | 1/1993 | Miyake | 330/279 |
| 5,212,814 | 5/1993 | Iwane | 455/126 |
| 5,309,115 | 5/1994 | Hashimoto et al. | 330/279 |
| 5,337,006 | 8/1994 | Miyazaki | 455/126 |
| 5,383,223 | 1/1995 | Inokuchi | 455/126 |

FOREIGN PATENT DOCUMENTS 4192636  7/1992  Japan .

Primary Examiner—Reinhard J. Eisenzopf
Assistant Examiner—Marsha D. Banks-Harold
Attorney, Agent, or Firm—Michael J. Balconi-Lamica; Laurie E. Gathman

[57] ABSTRACT

Transmitter including a controllable power amplifier, whose output signal is fed back to a control input of the power amplifier via a detector device which produces a detector signal for detecting the output power of the power amplifier, and comprising a signal generator for producing a control signal which is used for forming the output signal and has rising and falling edges. A control signal is derived from the comparison of the detector signal with the reference value which control signal has a rising edge and thus also terminates the increase of the transmitted power. The transmitter is used in time-division multiplex systems, more specifically, in mobile and fixed stations in a mobile radio system according to the GSM standard.

9 Claims, 2 Drawing Sheets

MOBILE RADIO SYSTEM/TRANSMITTER WITH A CONTROLLABLE POWER AMPLIFIER

BACKGROUND OF THE INVENTION

1. Field of the Invention

The invention relates to a mobile radio system comprising at least a transmitter which includes a controllable power amplifier whose output signal is fed back to a control input of the power amplifier via a detector device which produces a detector signal for detecting the output power of the power amplifier, and includes a signal generator for producing a control signal which is used for forming the output signal and has rising and falling edges.

The invention likewise relates to a transmitter used in such a mobile radio system.

2. Description of the Prior Art

In telecommunication systems in the time-division multiplex mode the variation with time of the output power of the power amplifier or the transmitted power of the transmitter is to be controlled or adjusted respectively, during a period of transmission. For example, the increase of transmitted power to a suitable power level and the final decrease of the transmitted power is to satisfy specific requirements, so that the interference to adjacent transmission channels is minimized.

More specifically, in mobile radio systems according to the GSM standard operating in the TDMA (Time-Division Multiple Access) mode, a mask is defined for the variation with time of the transmitted power during a time slot, which mask defines the permissible range boundaries of the level of the transmitted power in various time domains of a time slot. For example, the transmitted power is to be in a level range of 2 dB in width during data transmission. Furthermore, masks are defined for the various switching spectra of the various power levels to avoid interference to adjacent channels. In this manner limits are set to the variation with time of the increase and decrease of the transmitted power.

From Japanese published unexamined Patent Application 4-192636(A) is known a transmitter with a control loop comprising a controllable power amplifier, a detector device, a comparator (operational amplifier), a trapezoidal signal generating circuit and a reference voltage generating circuit. The detector device used for detecting the output power of the power amplifier, applies a detector signal to a first input of the comparator. The other input of the comparator is connected to the circuit generating the trapezoidal signals. The peak level of the trapezoidal signals is determined by the reference voltage. The output signal of the comparator is applied to the control input of the power amplifier.

The arrangement described here is devised as a closed control loop for the total duration of the time slot i.e. for the total duration of a transmission, i.e. the detector device is to be devised for all the level ranges of the transmitted power. In mobile radio systems according to the GSM standard the transmitted power covers a range of more than 70 dB. Detectors always producing an adequate detector signal in such a widespread level range demand much circuitry. Customary detector devices are generally incapable of detecting the output power of the power amplifier especially in the lower range of power levels. In such a case the control circuit described in said Japanese unexamined Patent Application is no longer closed and its function no longer guaranteed.

SUMMARY OF THE INVENTION

It is an object of the invention to provide a transmitter with a controllable power amplifier which transmitter observes, with little circuitry and expense, defined masks for the variation with time of the transmitted power and for the mask spectra.

With a transmitter of the type defined in the opening paragraph this object is achieved in that a control signal terminating the rising edges is derived from the comparison of the detector signal with a reference value.

When detectors are used which are incapable of coveting the whole power range of the transmitted power of the transmitter, no control of the transmitted power of the transmitter or of a power amplifier included in the transmitter is possible with a closed control loop. For this reason a detector signal fed back from the output of the power amplifier is used only under certain circumstances for checking the output power of the power amplifier. With the present invention a signal generator is provided which produces on transmission, i.e. during a time slot, a control signal characterized by rising and falling edges. The control signal is constant between a rising and a falling edge. A rising edge of the control signal determines the increase of transmitted power. The edge may have a linear pattern but also a curved pattern, for example, a cosine-shaped pattern. If the transmitted power has reached the necessary power level, a derived control signal, derived from the comparison of the detector signal with a fixed reference value, stops the rising edge of the control signal, in other words the further increase of the transmitted power. The signal generator then applies a constant control signal to the power amplifier and controls the transmitted power to a constant level, so that data transfer can take place. Fluctuations occurring in the transmitted power of the transmitter and caused by temperature fluctuations or variations of a supply voltage are negligible in very brief transmit pulses. The decrease of the transmitted power at the end of the time slot is determined by a falling edge of the control signal. This edge may again have a linear or a curved pattern. The beginning of a rising edge or the beginning of a falling edge respectively, of the control signal is determined by the positive or negative edge respectively, of a control pulse which pulse is produced by a synchronizing circuit arranged in the transmitter and is applied to a control input of the signal generator. Thus the detector signal that has been fed back only affects the end of the increase of the transmitted power and is not used any further. Such an arrangement for controlling the transmitted power of the transmitter can be realised with little circuitry and cost. More specifically, an expensive detector capable of coping with a very large level range of the transmitted power of the transmitter is no longer necessary. With such a transmitter, for example, the GSM specifications 05.05 and 11.10, parts II.3.3 and II.3.4 can be satisfied. In this application the transmitter is suitable for both mobile stations and base stations.

In an embodiment of the invention the signal generator is used for producing a trapezoidal control signal.

It is useful selecting a simplest possible shape of the control signal for the output signal of the power amplifier during transmission and thus selecting the control of the transmitted power. The trapezoidal signal shape represents in this respect the most advantageous solution. The rising and falling edges of the control signal have a linear pattern for this case. The generation of such a control signal by a signal generator requires only little circuitry and expense.

In a first of two further embodiments of the invention a second control input coupled to the output of the signal generator is provided. In the second embodiment there is a common control input of the power amplifier for receiving the control signal and a derived signal from the detector signal.

Power amplifiers may have one or also a plurality of control inputs. On the one hand there is a possibility to feed the control signal generated by the signal generator to a first control input and feed the feedback detector signal, which may be modified by further circuit components, to a second control input of the power amplifier. On the other hand, there is a possibility to superimpose the two signals on each other and apply the superimposed signal to a common control input of the power amplifier. In this manner the invention is suitable for transmitters comprising a power amplifier which has one or several control inputs.

The invention may further be arranged in that a common input of the power amplifier is used for receiving the control signal, the signal derived from the detector signal and a high-frequency signal to be amplified.

The invention also relates to transmitters with controllable power amplifiers which amplifiers have only one input for receiving a modulated high-frequency signal to be amplified and for receiving one or several control signals. In that case the power amplifier comprises circuits by which the high-frequency and control signals are separated. Such a circuit may comprise, for example, filter means.

A further embodiment of the invention comprises a superimposed connection for superimposing the control signal and a signal derived from the detector signal on each other.

In many cases the high-frequency signal to be amplified is superimposed on an interference signal which corresponds to an amplitude modulation. The undesired amplitude modulation is caused, for example, by the sub-ideal behaviour of modulators arranged in the transmitter. This interference signal is amplified by the power amplifier. The transmitted power of the power amplifier does not continue to be constant in this case during the transmission of digital high-frequency modulated data. A mere control by the control signal supplied by the signal generator is then, under specific circumstances, not enough to keep the output power of the power amplifier within a given level range. For this reason the control signal is superimposed by a signal derived from the detector signal. The superimposed signal available on the output of the superimposed connection is applied to the control input of the controllable power amplifier. The signal derived from the detector signal is used for an additional control of the output power of the power amplifier. In this manner, even an amplified high-frequency signal superimposed by a rapidly varying interference signal can be transmitted by the power amplifier with a constant transmitted power.

The invention is further embodied in that the signal available on the output of the superimposed connection is, in essence, determined by the control signal.

The superimposed connection superimposes the control signal produced by the signal generator and the signal derived from the detector signal and fed back from the output of the power amplifier. In general, the detector as described above is incapable of detecting small transmitted powers. Thus there is no closed control loop when there are small transmitted powers. If the signal present on the output of the superimposed connection is essentially determined by the control signal, however, the influence of the feedback signal derived from the detector signal is negligible during the rise and fall of the output power of the power amplifier. Only with a constant transmitted power i.e. during the transmission of the data to be transferred, does the control loop closed now display the desired effect. It constantly controls the output power of the power amplifier and prevents slight fluctuations of the transmitted power.

A further possibility of an embodiment of the invention is coupling a control circuit between the detector device and a superimposed connection.

To obtain a highly effective operation of the closed control loop, it is advantageous to include a control circuit in the feedback loop as described hereinbefore. Such a control circuit may comprise, for example, a PI controller.

A further possibility of embodying the invention is characterized in that the superimposed connection comprises a first resistor connected to the output of the signal generator and a second resistor connected to the output of the controller, the other terminals of which resistors forming the output of the superimposed connection and in that the output of the superimposed connection is connected to a third resistor whose other terminal is coupled to ground potential.

As described above, the superpositioning of the control signal available on the output of the signal generator by the feedback signal derived from the detector signal can be simply realised with three resistors. By properly rating the first and second resistors, the influence of the two signals on the signal available on the output of the superimposed connection can be adjusted. If, for example, the resistance of the second resistor is selected to be substantially larger than that of the first resistor, the control signal available on the output of the signal generator determines the signal applied to the control input of the power amplifier. Such an embodiment of the superimposed connection is possible with minimum cost of circuitry and is very cost effective.

BRIEF DESCRIPTION OF THE DRAWINGS

Embodiments of the invention will be further explained with reference to the following drawings, in which:

FIG. 3 shows time diagrams of two input signals of a signal generator which generates a control signal and of the output signal of the signal generator, and.

DETAILED DESCRIPTION OF THE PREFERRED EMBODIMENT

Figure 1:
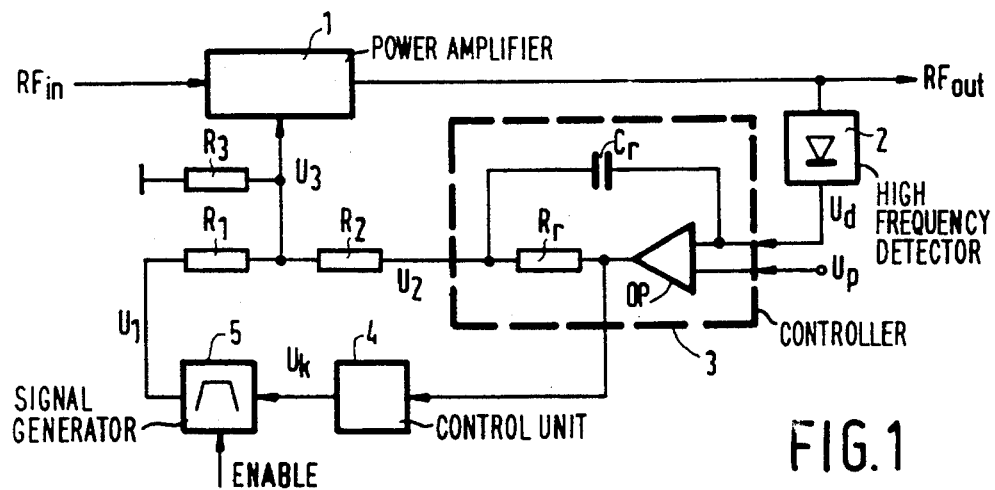
FIG. 1 shows a first embodiment for a transmitter comprising a controllable power amplifier.

In FIG. 1 is shown a power amplifier 1 comprising a control/setting circuit. The high-frequency signal $RF_{in}$ is available at the input of the power amplifier and the high-frequency signal $RF_{out}$ formed by an amplification of the high-frequency signal $RF_{in}$ is available on its output. A high-frequency detector 2 detects the transmitted power of the transmitter and output power of the power amplifier 1 respectively, and converts them to a detector voltage $U_d$. The detector voltage $U_d$ is applied to a first input of a controller 3. The controller 3 has a further input to which is fed a reference voltage $U_p$ which corresponds to the constant output power of the power amplifier when data are transmitted during a transmit pulse. The controller 3, a PI controller, comprises an operational amplifier OP, a resistor $R_r$ and a capacitor $C_r$. A first input of the operational amplifier OP is supplied with the detector voltage $U_d$ and a second input is supplied with the reference voltage $U_p$. The two inputs of the operational amplifier OP are connected to the inputs of the controller 3. A terminal of the resistor $R_r$ is connected to the output of the operational amplifier OP. The other terminal of the resistor $R_r$ is connected to a first output of the controller 3. The first output of the controller 3 is fed back to the first input of the operational amplifier OP via the capacitor $C_r$. A second output of the controller 3 is connected to the output of the operational amplifier OP and the input of a control unit 4. The latter supplies a control voltage $U_k$ to a first input of a signal generator 5. A second input of the signal generator 5 is supplied with a control signal ENABLE. The signal generator 5 produces a control voltage $U_1$. Between the output of the signal generator 5 and a control input of the power amplifier 1 is coupled a resistor $R_1$. This control input of the power amplifier 1 is further coupled, via a resistor $R_2$, to the first output of the controller 3 on which a control voltage $U_2$ is available, and via a resistor $R_3$ to ground potential. A control voltage $U_3$ is available at the control input of the power amplifier 1.

In the following the operation of such a circuit during a transmission will be described. A transmission is introduced in that the signal generator 5 is supplied with a pulse-shaped control signal ENABLE generated by a synchronizing circuit (not shown). The rising edge of the control signal ENABLE causes the control voltage $U_1$ to rise, which had henceforth the value of 0 volts. The control voltage $U_1$ and the control voltage $U_2$ produced by the controller 3 are superimposed on each other by a superimposed connection formed by the resistors $R_1$, $R_2$ and $R_3$. The resistor $R_1$ is selected to be 1.5 k$\Omega$, the resistor $R_2$ is selected to be 27 k$\Omega$. The resistance of $R_2$ being considerably larger than that of $R_1$ provides that the control value $U_3$ available on the output of the superimposed connection is determined, in essence, by the control voltage $U_1$. The correlation can be described by the following formula $$U_3 = k\{(U_1/R_1) + (U_2/R_2)\}$$

if a large input resistance of the control input of the power amplifier 1 is assumed. k represents a constant value in which the resistances of $R_1$, $R_2$ and $R_3$ play a role. By increasing the control voltage $U_1$, the control voltage $U_3$ is increased likewise. This causes the gain factor or the output power of the power amplifier 1 to increase. At this stage the detector 2 produces a detector voltage $U_d$ which is smaller than the reference voltage $U_p$. The operational amplifier OP and thus also the controller 3 are driven to full output. The controller 3 then does not take over a control function for controlling the output power of the power amplifier 1. If the power amplifier 1 reaches the desired output power level after a specific period of time, the detector 2 will produce a detector voltage $U_d$ which is equal to the reference voltage $U_p$. Now the operational amplifier OP or the controller 3 respectively, leaves the range of full output power. The control unit 4 coupled to the output of the operational amplifier generates a control voltage $U_k$. This terminates the rise of the control voltage $U_1$ produced by the signal generator 5. From that moment on a period of constant output power of the power amplifier 1 begins in which data transmission can take place. In this period of time the part of the control voltage $U_2$ in the control voltage $U_3$ is important to avoid minor fluctuations of the output power of the power amplifier 1 and thus to control the transmitted power to a constant level. Such fluctuations are caused, for example, by an undesired amplitude modulation of the high-frequency signal $RF_{in}$ available at the input of the power amplifier. The reason for such an amplitude modulation can be found, for example, in the sub-ideal proportion of the modulators included in the transmitter; in a GSM system they are GMSK modulators (Gaussian minimum shift keying).

When all the data have been transmitted, the transmitter switches off the control signal ENABLE i.e. switches same to the value of 0 volts via the synchronizing circuit. The falling edge of the control signal ENABLE causes the control voltage $U_1$ to drop to the value of 0 volts. This also causes the control voltage $U_3$ to drop and the output power of the power amplifier to drop to zero. The controller 3 is now driven to full output again. The control unit 4 is reset and no longer generates a control voltage $U_k$. The described procedure is repeated at a later transmission.

The rise and fall of the control voltage $U_1$ presents substantially a linear pattern. The pattern of the control voltage $U_1$ can thus be described as a trapezoidal pattern. A linear rise and fall of the control voltage $U_1$ can be simply produced by the signal generator 5. If necessary, however, it is possible to produce a non-linear, for example, cosine-shaped rise and fall of the control voltage $U_1$ by the signal generator 5.

With this arrangement it is possible in particular to produce a high-frequency transmit pulse which complies with the GSM specifications 05.05 and 11.10, part II.3.3 and II.3.4. In this manner the transmitted power is kept sufficiently constant during data transmission. Alternatively, transmit pulses may be generated whose spectrum on either one of the two sides of the associated carrier frequency decreases strongly enough for the adjacent channels not to be interfered.

Figure 2:
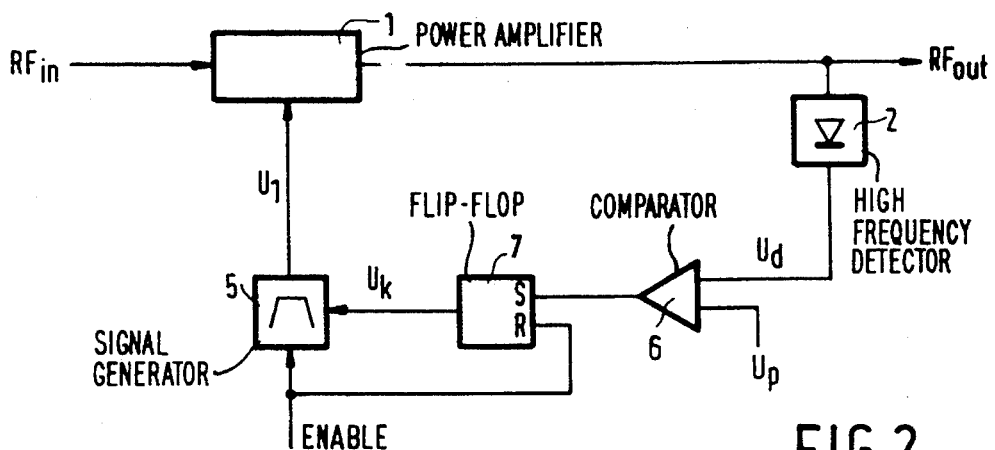
FIG. 2 shows a second embodiment for a transmitter comprising a controllable power amplifier.

FIG. 2 shows a controllable power amplifier 1 comprising a simplified circuit compared with FIG. 1. The detector voltage $U_d$ of the detector 2 is here applied to a first input of a comparator 6. The second input of the comparator is supplied with the reference voltage $U_p$. The output of the comparator 6 is connected to the set-input of a flip-flop 7. The flip-flop 7 produces a control voltage $U_k$ which is applied to the first control input of the signal generator 5. The second control input is supplied with a control signal ENABLE similarly to FIG. 1. This control input of the signal generator 5 is furthermore coupled to the reset-input of the flip-flop 7. The control voltage $U_1$ generated by the signal generator is applied to the control input of the power amplifier 1.

Similarly to FIG. 1, the control voltage $U_1$ and thus the output power of the power amplifier 1 is increased as a result of a rising edge of the control signal ENABLE. The signal generator increases the output power of the power amplifier 1 via the control voltage $U_1$ for such a period of time until the detector voltage $U_d$ has reached the value of the reference voltage level $U_p$. Subsequently, the comparator 6 produces a voltage which sets the previously reset flip-flop 7. This flip-flop now produces a control voltage $U_k$ which terminates the further increase of the control voltage $U_1$. The signal generator 5 then generates a constant control voltage $U_1$ and thus controls the output power of the power amplifier 1 to a constant level, so that a data transmission can take place. When all the data have been transmitted, the control voltage ENABLE again assumes the value of 0 volts. Subsequently, the control voltage $U_1$ and thus also the output power of the power amplifier 1 drops as described above. The falling edge of the control signal ENABLE resets the flip-flop 7. The flip-flop 7 is used to avoid fluctuations of the control signal $U_k$ once the detector voltage $U_d$ has reached the reference voltage level $U_p$. Then, while the data are being transmitted, the transmit power and thus also the detector voltage $U_d$ slightly fluctuates despite the control by the control voltage $U_1$. The detector voltage $U_d$ oscillates around the value of the reference voltage $U_p$ and, as a result, the output voltage of the comparator 6 constantly turns over. A flip-flop 7 arranged as described above provides that the control signal $U_k$ does not fluctuate like the slight fluctuations of the detector signal $U_d$.

In the circuit shown in FIG. 2 there is no control of the output power of the power amplifier 1 via the feedback detector signal $U_d$. There is no branch comprising a controller. The feedback detector signal $U_d$ controls only the end of the rising edge of the control signal $U_1$. Despite the lacking control by the feedback detector signal ($U_d$), specially during data transmission, said GSM specifications can be satisfied with this circuit when the amplitude modulation of the signal to be amplified (caused by sub-ideal modulators) is not too large, because a time slot in a GSM system is very brief and interference caused by temperature or supply voltage variations is negligibly small.

The circuits shown in FIGS. 1 and 2 comprise a power amplifier 1 which has a control input. The circuit shown in FIG. 1 can, however, also be realised with a power amplifier that has two control inputs which receive the control voltages $U_1$ and $U_2$. In this manner no superimposed connection for superpositioning two such control voltages is necessary. Furthermore, it is possible to combine one or various control inputs and the high-frequency input of the power amplifier to a single input. In that case a control voltage such as $U_1$, $U_2$ is to be removed via an isolating capacitor from the part of the transmitter that generates the high-frequency signal $RF_{in}$ to be amplified.

Figure 3:
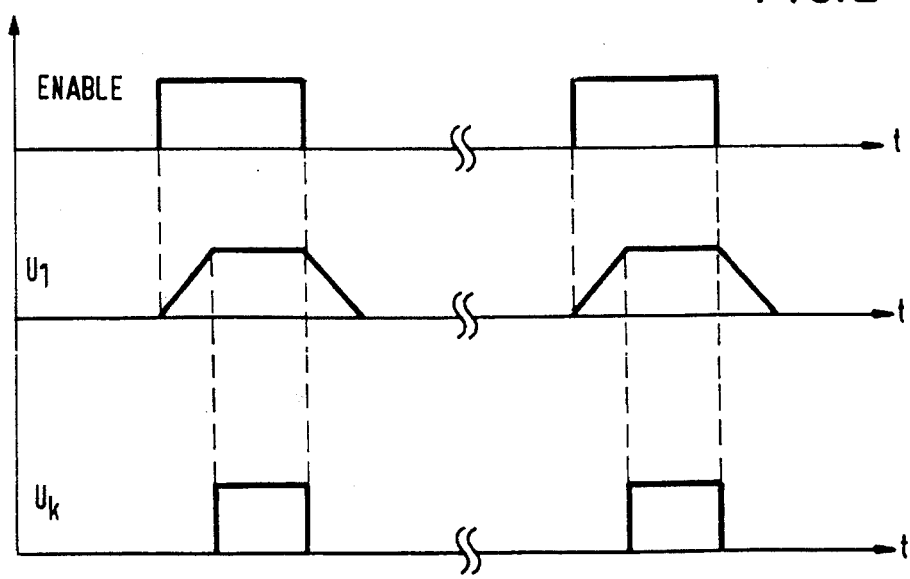

The time diagram shown in FIG. 3 clarifies the correlation between the two control signals ENABLE and $U_k$ applied to the signal generator 5 and the control signal $U_1$ generated by the signal generator 5. $U_1$ is formed by signals having a trapezoidal pattern. The rising or falling edges respectively, of $U_1$ in this case have a linear pattern. The beginning of a rising edge of $U_1$ is determined by the considerably steeper rising edge of a control pulse of the control signal ENABLE. The increase of the control voltage $U_1$ is terminated at the occurrence of a rising edge of the control signal $U_k$. This is the case when the detector voltage $U_d$ reaches the reference voltage level $U_p$. A subsequent period of time of a constant voltage $U_k$ during which a data transmission is effected, is terminated by a steeply falling edge of the control signal ENABLE. This edge furthermore causes the control voltage $U_k$ to drop to 0 volts. $U_1$ is now reduced to 0 volts.

Figure 4:
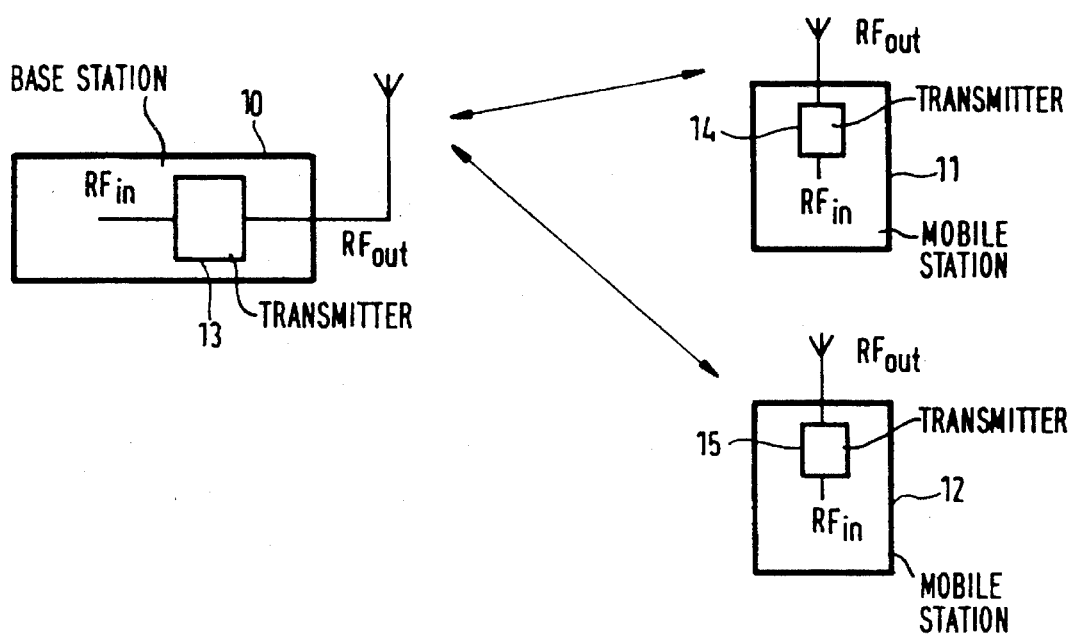
FIG. 4 shows a mobile radio system comprising transmitters according to the invention.

FIG. 4 represents a mobile radio system according to the invention. The mobile radio system comprises a base station 10 and two mobile stations 11 and 12 while further base stations and mobile stations can be added. At the base station 10 a transmitter 13 according to the invention is arranged as described with respect to FIG. 1 or 2. The mobile stations 11 and 12 likewise comprise each a transmitter 14 or 15 respectively, according to the invention and shown in FIG. 1 or 2.

We claim:

1. Mobile radio system comprising at least a transmitter which includes a controllable power amplifier whose output signal is fed back to a control input of the power amplifier via a detector device which produces a detector signal for detecting the output power of the power amplifier, and includes a signal generator for producing at an output of the signal generator a first control signal which is used for forming the power amplifier output signal, the first control signal having rising and falling edges, and further includes means for deriving a signal generator control signal, the signal generator control signal for terminating the rising edges of the first control signal and further being derived from a comparison of the detector signal with a reference value.

2. Mobile radio system as claimed in claim 1, wherein the signal generator is used for producing a trapezoidal control signal.

3. Mobile radio system as claimed in claim 1, wherein the power amplifier has a second control input which is coupled to the output of the signal generator.

4. Mobile radio system as claimed in claim 1, wherein said deriving means further for deriving a second control signal derived from the detector signal, further wherein a common control input of the power amplifier is used for receiving the first control signal and the second control signal.

5. Mobile radio system as claimed in claim 1, wherein a superimposed connection is used for superimposing the first control signal and a second control signal derived from the detector signal on each other.

6. Mobile radio system as claimed in claim 5, wherein a signal available on the output of the superimposed connection is, in essence, determined by the first control signal.

7. Mobile radio system as claimed in claim 5, wherein a control circuit is coupled between the detector device and the superimposed connection, the control circuit for deriving the second control signal.

8. Mobile radio system as claimed in, claim 7, further wherein the superimposed connection comprises a first resistor connected to the output of the signal generator and a second resistor connected to the output of the control circuit, the other terminals of which resistors forming the output of the superimposed connection and wherein the output of the superimposed connection is connected to a third resistor whose other terminal is coupled to ground potential.

9. Transmitter including a controllable power amplifier whose output signal is fed back to a control input of the power amplifier via a detector device which produces a detector signal for detecting the output power of the power amplifier and including a signal generator for producing at an output of the signal generator a first control signal which is used for forming the power amplifier output signal, the first control signal having rising and falling edges, and further including means for deriving a signal generator control signal for terminating the rising edges of the first control signal, the signal generator control signal being derived from a comparison of the detector signal with a reference value.

* * * * *